(12) United States Patent
Flynn

(10) Patent No.: US 6,513,342 B1
(45) Date of Patent: Feb. 4, 2003

(54) WATER TIGHT AIR VENT FOR TELECOMMUNICATIONS MICRO-CELL VAULT

(76) Inventor: Thomas Flynn, 248 St. Tropez, Laguna Beach, CA (US) 92651

( * ) Notice: Subject to any disclaimer, the term of this patent is extended or adjusted under 35 U.S.C. 154(b) by 0 days.

(21) Appl. No.: 09/909,161

(22) Filed: Jul. 18, 2001

(51) Int. Cl.[7] ............... F25D 23/12; H05K 7/20
(52) U.S. Cl. ............... 62/259.2; 361/688; 361/692
(58) Field of Search ............... 62/259.2, 3.2, 62/3.3, 3.7, 3.6, 260; 165/80.2, 104.33; 361/676, 688, 689, 690, 692, 694

(56) References Cited

U.S. PATENT DOCUMENTS

| | | | | |
|---|---|---|---|---|
| 2,932,953 A | * | 4/1960 | Becket et al. | 62/3.3 |
| 3,345,449 A | * | 10/1967 | Hiller | |
| 4,449,579 A | * | 5/1984 | Miyazaki et al. | 165/104.33 |
| 6,164,369 A | * | 12/2000 | Stoller | 165/104.33 |
| 6,304,441 B1 | * | 10/2001 | Han | 165/80.3 |

\* cited by examiner

*Primary Examiner*—Chen-Wen Jiang
(74) *Attorney, Agent, or Firm*—Orrick, Herrington & Sutcliffe, LLP

(57) ABSTRACT

An improved micro-cabinet or vault that facilitates the underground storage of electronic equipment, such as instrumentation for wireless telecommunications antenna systems. The micro-cabinet of the present invention is formed of a metal weldment, preferably stainless steel, which enables it to be made comparatively small without sacrificing strength or equipment security. Because of its reduced size, the micro-cabinet can easily be placed in a public right of way. The micro-cabinet is substantially water-tight with a cooling system and a water evacuation system.

26 Claims, 5 Drawing Sheets

WATER TIGHT AIR VENT FOR TELECOMMUNICATIONS MICRO-CELL VAULT

FIELD OF THE INVENTION

The present invention relates generally to enclosures for electronic equipment and, more particularly, to a micro-cabinet or vault that facilitates the underground storage of electronic equipment, such as instrumentation for wireless telecommunications transceiver systems.

BACKGROUND OF THE INVENTION

Public demand for wireless telecommunications has grown at a tremendous rate. An increasing number of people rely on their wireless phones for an increasing number of uses including voice, messaging, data, video, and internet access. This enormous public demand has in turn fueled the need for additional carrier antenna sites to provide expanded wireless coverage to communities.

As the need for additional antenna sites has grown, so too has the installation restrictions set by many municipalities. Cell phone carriers are being required to place their transceiver equipment in an aesthetically pleasing manner. In many municipalities the planning departments are unwilling to grant permit applications for unsightly tower installations. There is also a growing tendency for many of these municipalities to require even the smallest of transceiver circuitry units to be placed underground, and for the antennas to be disguised or stealthed.

A partial, but elegant, solution for many carriers has been to disguise their antennas by placing them atop of street light standards or other vertical structures, such as signs, etc., along existing right of ways. However, no such solution is currently available to cell phone carriers for burying their transceiver circuitry.

The units housing the transceiver or transmitting and receiving circuitry for wireless telecommunications systems come in different sizes, and have different power and transceiver configurations. The standard or "macro-cell" unit is a compact base transceiver station ("BTS"), which stores six (6) to eight (8) transceivers or radios requiring 1800 to 2200 watts of power. The smallest unit currently used, primarily where a mono-pole transceiver system is inappropriate, is a "micro-cell", which typically houses one (1) to two (2) transceivers requiring 170 to 600 watts of power. Currently, the vaults available to place the compact BTS's or micro-cells underground tend to be too large to be useful in right of way applications many carriers are looking to implement. Typically these vaults are made of concrete, which for strength and equipment security reasons require thick walls and considerable overall size. Because of their overall size, there are limits as to where these vaults can be placed.

In addition, the problem with any self-contained, sealed underground vault is that the telecommunications equipment enclosed therein generates heat, which ultimately damages or destroys the equipment. Moisture, either from evaporation or flooding from rain, can also damage or destroy the equipment. These problems are typically solved by using an air conditioner and dehumidifier in conjunction with a water pump, which add to the complexity and cost of the vault. Most existing vaults include an unattractive heat exchanger that is located above ground, or an underground heat exchanger that is quite costly to construct and install, and adds to the overall space needed to bury the vault.

Thus, it would be desirable to provide the wireless telecommunications industry with a vault to house micro-cells underground that is considerably smaller in size without sacrificing strength or security, and which maintains proper climate control for equipment longevity without cost or aesthetically prohibitive heat exchangers.

SUMMARY OF THE INVENTION

The present invention is directed to an improved vault or cabinet for storage of electronic equipment, such as wireless telecommunications equipment, underground in public right of ways. In a particularly innovative aspect of the invention, the micro-cabinet of the present invention is formed of a metal weldment, preferably stainless steel, which enables it to be made comparatively small without sacrificing strength or equipment security. Because of its reduced overall size, the micro-cabinet can easily be placed in a public right of way.

In another innovative aspect of the present invention, the micro-cabinet is substantially water-tight with a self contained cooling system and a water evacuation system. The water evacuation system preferably utilizes a one-way pressure actuated exhaust valve that enables the cabinet to be submerged in water with no danger to the enclosed equipment. Alternative cooling systems utilize similar one-way valves or snorkel-type piping running up an existing vertical structure along the public right of way.

In yet another innovative aspect of present invention, the micro-cabinet includes a weight or spring assisted rack for storage of transceiver equipment in the cabinet. The weight or spring assist system provides easy access to the stored electronic equipment when maintenance or repairs are necessary. In addition, the rack is preferably constructed to act as an internal support or brace for the micro-cabinet to further enhance the cabinet's overall structural integrity.

In a further innovation aspect of present invention, the micro-cabinet is preferably buried in a public right of way adjacent an existing vertical structure such as a light standard or sign. Cabling runs from the transceiver circuitry within the cabinet up along the interior or exterior of the vertical structure to an antenna positioned on top of the vertical structure. Unlike conventional designs, the vault or micro-cabinet of the present invention can be placed in virtually any city, under any existing vertical structure, e.g., a light standard, which is mounted on or near a sidewalk, while being fully disguised, and tending to pose no hazards to pedestrians.

In yet another innovative aspect, a cooling system of the present invention tends to eliminate the need for an electric powered air conditioner and dehumidifier, which tends to significantly reduce costs and advantageously enables the micro-cabinet to be dramatically smaller than most other telecommunication vaults. The cooling system of the present invention also advantageously enables a generator to be placed within the micro-cabinet, which ordinarily would be infeasible due to the cooling requirements of the generator.

In a preferred embodiment, the cooling system comprises a separate compartment attached to the end of the micro-cabinet, sharing a common wall. An opening or cooling vent is positioned toward the top of the common wall to allow hot air and moisture to vent from the micro-cabinet to the separate compartment. The separate compartment has air vents on the top, exposed to surface air, and louvered so that rain or water entering the separate compartment cannot fall through the opening in the common wall. These air vents allow heat and moisture to escape from the vault. A closure system comprising a door and a flotation device is provided to seal the cooling vent in the common wall. The door is mounted in moveable relation to the common wall and the flotation device, which causes the door to rise and seal the cooling vent as water fills the separate compartment, is operably coupled to the door.

Other innovative aspects of the invention include the preceding aspects individually or in combination.

Other aspects and features of the present invention will become apparent from consideration of the following description taken in conjunction with the accompanying drawings.

DETAILED DESCRIPTION OF PREFERRED EMBODIMENTS

Figure 1:
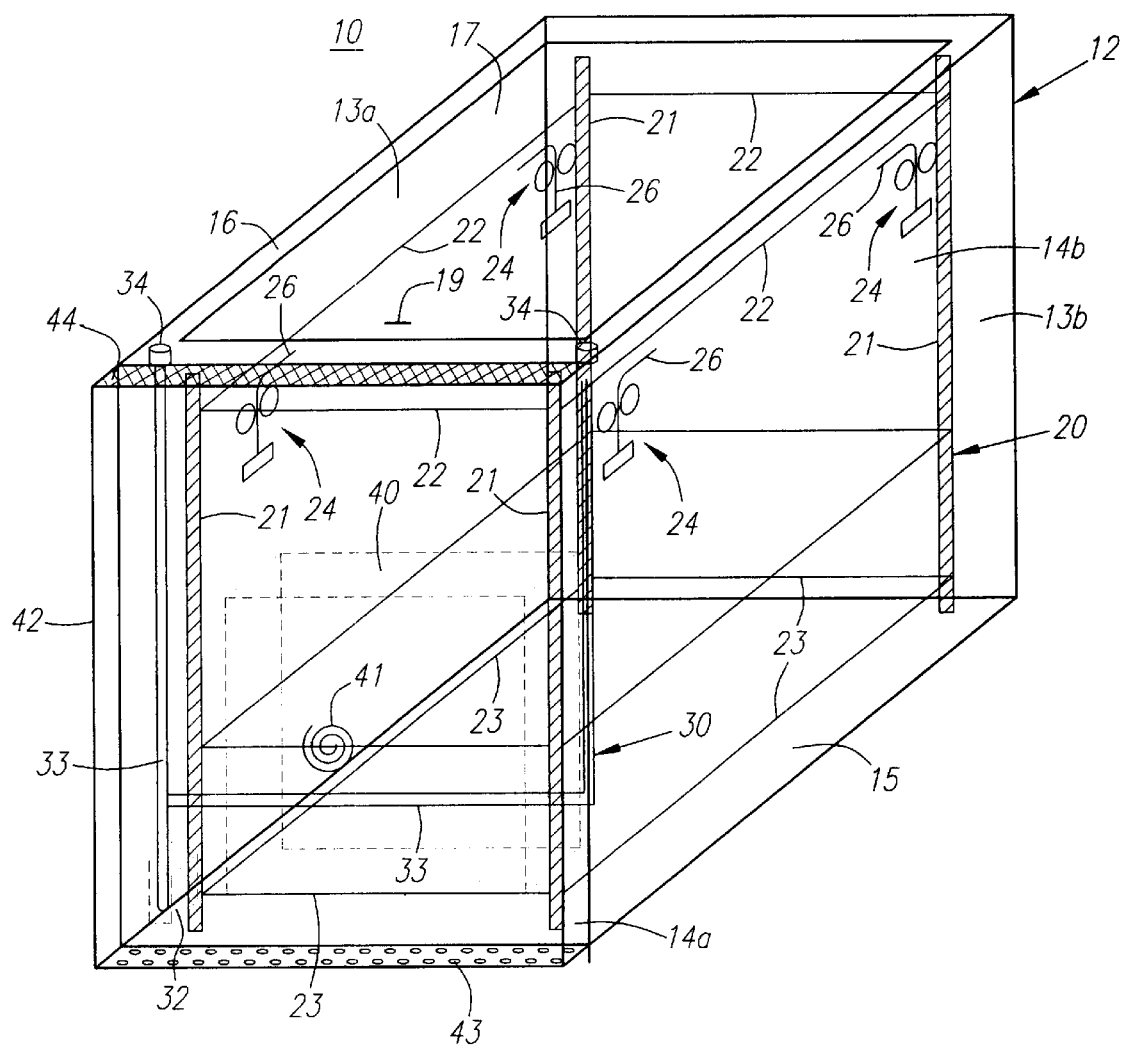
FIG. 1 Element number 30 has been added to FIG. 1. A marked version of FIG. 1 is attached with the amended portion appearing in red.

Referring to FIG. 1, a micro-cabinet or vault 10 of the present invention is shown. The micro-cabinet 10 includes an enclosure 12 that is preferably formed as a metal weldment. In a preferred embodiment, the enclosure 12 is a stainless steel weldment. Use of a metal, such as stainless steel, advantageously allows the surrounding earth to aid in the dissipation of heat from the micro-cabinet 10 and, also, advantageously enables the micro-cabinet 10 to be smaller, without sacrificing strength or equipment security. The enclosure is preferably about two (2) feet wide by three (3) feet long by four (4) feet deep, which is extremely small when compared to conventional underground vaults, and, depending on the transceiver configuration of the unit, the cabinet may vary between two (2) and five (5) feet in length. As a result, the micro-cabinet 10 can advantageously be placed next to or under vertical structures, such as a light standard, in existing public rights of way.

The enclosure 12 includes first and second side plates 13a and 13b, first and second end plates 14a and 14b, a bottom plate 15, and a top plate 16, which are preferably welded together. The top plate 16 includes an equipment access opening through which equipment can be loaded into the cabinet 10 or accessed for repair and maintenance. The opening is closeable by a hatch door 17. The hatch 17 includes a handle 19, a releasably lockable hinge or shock absorber-type hinge to maintain the hatch 17 in a generally vertical position, a security locking system, and a magnetic seal similar to those used on refrigeration units. The micro-cabinet 10, with its metal enclosure 12 and watertight sealable hatch 17, tends to be more watertight than conventional units, and, unlike the concrete walls of conventional vaults, the stainless steel walls of the present invention tend to minimize condensation.

Figure 2:
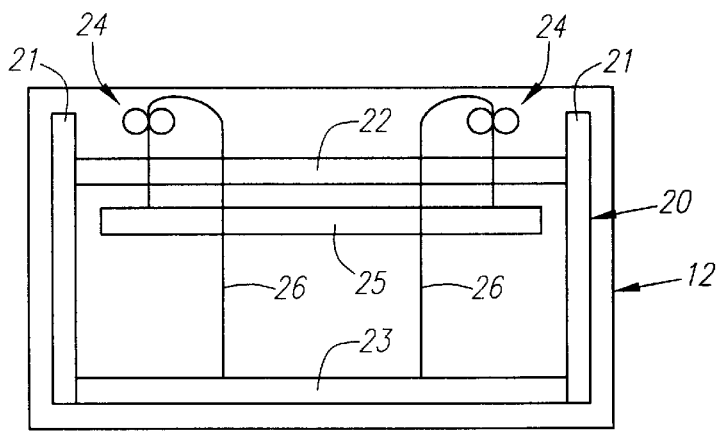
FIG. 2 is a plan view of the micro-cabinet shown in FIG. 1 with a rack of the present invention shown in a down position.
Figure 3:
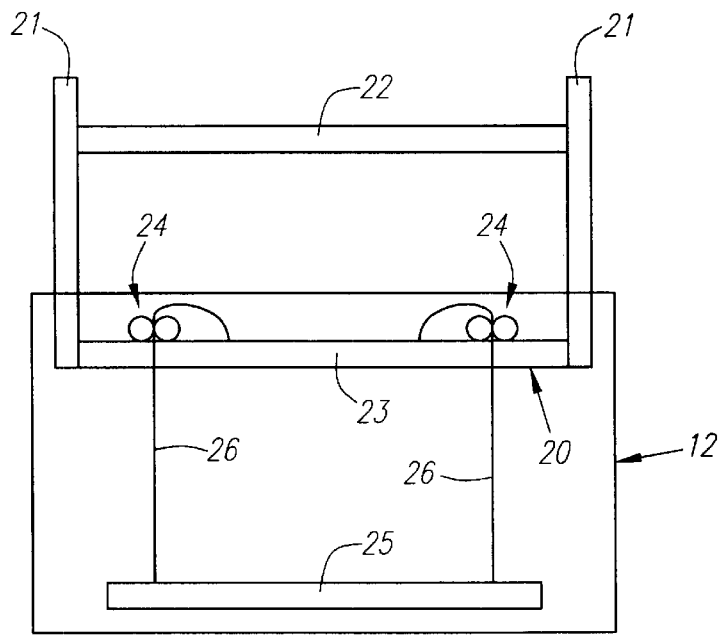
FIG. 3 is a plan view of the micro-cabinet with the rack shown in a raised position.

Referring to FIGS. 1–3, the micro-cabinet 10 of the present invention preferably includes a weight assisted rack 20 mounted inside the enclosure 12 to place telecommunications equipment in the enclosure 12 and to allow easy access by maintenance personnel when repairs are needed. The rack 20 includes four (4) generally vertically positioned posts 21 and eight (8) top 22 and bottom 23 cross members. The posts 21 and cross-members 22 and 23 are preferably sized such that the outer extremities of the rack 20 are positioned closely adjacent to the inner walls of the cabinet 10. In such a configuration, the rack 20 tends to provide additional support to the micro-cabinet 10. As a result, the overall structural integrity of the micro-vault 10 is enhanced without the need to add separate internal supports or bracing.

The rack preferably includes four pulley systems 24 mounted in the enclosure 12 adjacent to the top and side plates 16 and 13i a–b. Cables 26 pass through the pulleys and attach at opposing ends to a bottom cross member 23 and a weight 25. The weights 25 are of sufficient weight to cause a fully loaded unrestrained rack 20 to rise out of the enclosure 12 as shown in FIG. 3. The weights 25 are preferably 25 to 50 pounds heavier than a fully loaded rack 20, thus requiring a maintenance worker to apply 25 to 50 pounds of offset downward force to position the rack 20 and electronic equipment in the enclosure 12. Hooks or brackets (not shown) are preferably used to maintain the rack 20 in a down position as shown in FIG. 2.

In an alternative embodiment, the pulley and weight system is replaced by springs. The springs are of sufficient strength such that a fully loaded unrestrained rack 20 is caused to rise out of the enclosure 12. An offset force of 25 to 50 pounds is necessary to reposition the rack 20 in the enclosure 12.

Figure 4:
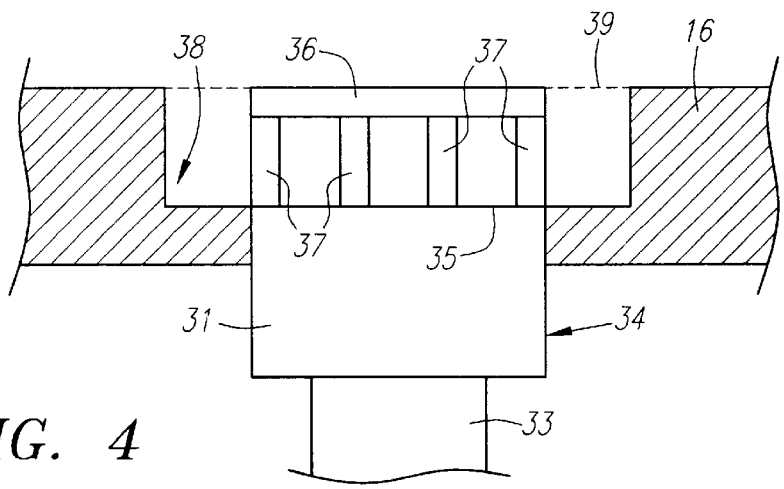
FIG. 4 is a detail view of an exhaust valve of the present invention.

Referring to FIGS. 1 and 4, the micro-cabinet 10 of the present invention includes a novel water evacuation system 30 which is capable of venting any pooled water from the cabinet 10. The evacuation system 30 includes a float-type sump pump 32 located in the bottom of the cabinet 10. A pipe 33 extends from the pump 32 to exhaust valves 34 mounted to the top plate 16 of the cabinet 10. The exhaust valve 34 is a commonly known one-way, pressure-type check valve. The one-way valve 34 tends to enable the vault 10 to actually be submerged underwater (a concern to carriers) with no leakage of water into the cabinet 10 and, thus, no danger to the equipment inside.

The valve 34, as shown in detail in FIG. 4, is preferably mounted within a recess 38 formed in the top plate 16 of the cabinet 10 such that the valve-seat 35 of the valve 34 is flush with the base of the recess 38. A valve cap 36 is slidable attached to the valve body 31. The cap 36 includes slide posts 37 that are fixedly attached to the cap 36 and slidably received in stops formed on the interior of the valve body 31. In operation, the cap 35 is forced upwardly by the pressure of the water flowing through the pipe 33. The water exhausts through the holes formed between the slide posts 37. The slide posts 37 are preferably formed of a predetermined length to ensure that the cap 35 is raiseable no further than to a position where it is flush with the top surface of the top plate 16 of the cabinet 10. Optionally, the recess 38 may be covered with a perforated grate 39. Because the cabinet's 10 top surface tends to be smooth or free of protruding parts, the cabinet 10 can be freely placed in and under public right of ways without tending to pose a hazard to pedestrians.

Although the construction of the micro-cabinet 10 advantageously allows the surrounding earth to aid in the dissipation of heat from the cabinet 10, this cooling effect may be insufficient in certain climate conditions or as a result of equipment power consumption. A reduction in humidity or condensation within the cabinet may also be desirable for increased component life even when the temperature within the cabinet is being maintained at a desirable level, i.e., at or below about 100° Fahrenheit. To accommodate these potential cooling requirements, the micro-cabinet, as shown in FIG. 1, includes a self contained air conditioning unit 40, such as a Model CR23 air conditioner manufactured by Hoffman, which cools and re-circulates the air within the cabinet 10 without needing to draw in air from the exterior of the cabinet 10. The air conditioner 40, which is shown mounted internally on end wall 14a, includes a low profile heat exchanger 41 mounted external to the micro-cabinet 10. A protective vent cage 42 is constructed about the heat exchanger 41 and is attached to the end 14a of the cabinet 10. The cage 42 is formed of metal plating similar to the cabinet 10 with a perforated grate 44 covering the top of the cage 42 to allow air or water to circulate into the cage 42 to cool the heat exchanger 41. The bottom of the cage 42 includes several holes 43 formed therein to allow condensation and water to weep. The upper portion of the cage 42, above the heat exchanger 41, may optionally include a filter-type material that is permeable to water and air and semi-permeable to dirt and debris. Inclusion of such material will tend to keep the heat exchanger 41 clean and working more efficiently.

Figure 5:
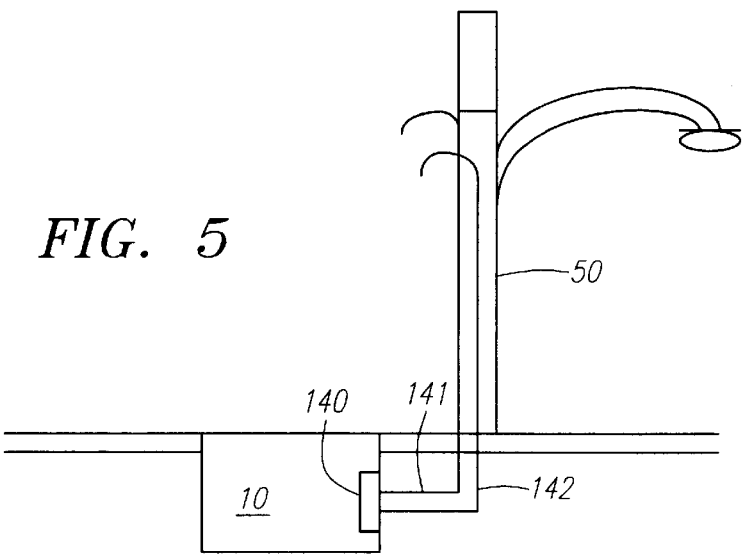
FIG. 5 is a plan view of an antenna site utilizing the micro-cabinet showing a cooling system alternative embodiment.

Alternatively, as shown in FIG. 5, the micro-cabinet 10 of the present invention includes a cooling system that utilizes a pump 140 to draw cool air into the cabinet 10 and exhaust hot air out of the cabinet through a pair of vent pipes 141 and 142. The vent pipes would preferable extend along the interior or exterior of an existing light standard or sign pole 50. The ends of the vent pipes 141 and 142 are preferably bent over or hooded to prevent rain from entering the pipes and, thus, the cabinet 10.

Figure 6:
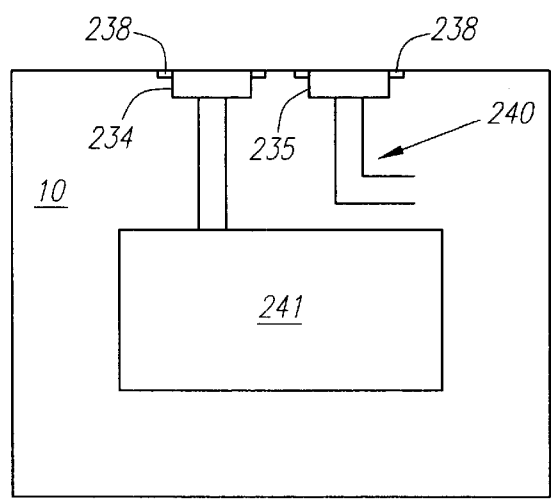
FIG. 6 is an end view of the micro-cabinet showing a cooling system alternative embodiment.

Another alternative cooling system 240 for the cabinet 10 of the present invention, as shown in FIG. 6, may utilize pop-up valves 234 and 235, which are similar to the exhaust valves 34 of the water evacuation system 30 shown in FIGS. 1 and 4. An exhaust valve 234 of the cooling system 240. is preferably a one-way, pressure-type pop up valve like valve 34. However, an intake valve 235 is preferably a one-way, normally closed, solenoid-operated pop up valve. Like valve 34, the valves 234 and 235 of this alternative cooling system 240 are preferably mounted in recesses 238 formed in the top plate 16 and preferably pop-up flush with or below the top surface of the top plate 16. In operation, the solenoid-operate intake valve 235 is caused to open when the air condition unit or air pump 241 is activated. The pressure of the exhausting air will cause the exhaust valve 234 to open.

Figure 7:
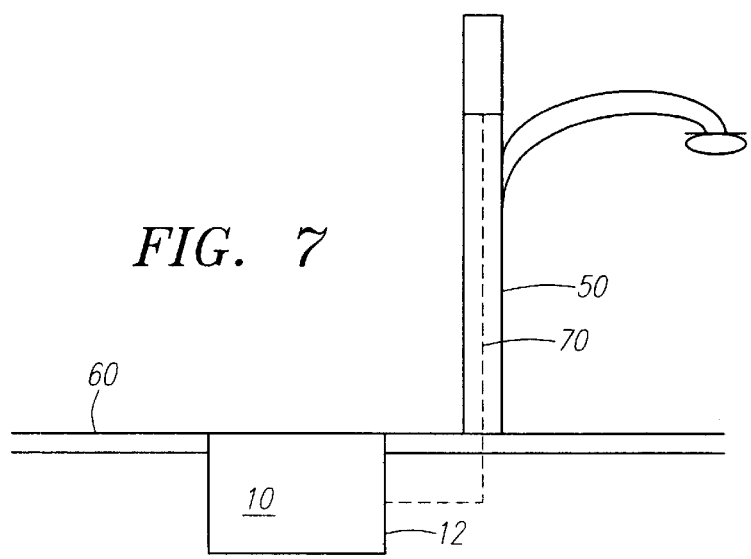
FIG. 7 is a plan view of an antenna site utilizing the vault of the present invention.

In operation, the micro-cabinet 10 of the present invention is preferably buried, as shown in FIG. 7, in a public right of way 60 adjacent an existing vertical structure 50 such as a light standard or sign. Cabling 70 runs from the transceiver circuitry within the enclosure 12 up along the interior or exterior of the vertical structure 50 to an antenna 80 positioned on top of the vertical structure 50. The transceiver equipment is used to transmit and receive signals in a manner understood by those of skill in the art.

Turning to FIGS. 8a, 8b, 9 and 10, an alternative embodiment of the micro-cabinet 10 of the present invention is shown. The micro-cabinet 10 includes a cooling system 300 that preferably comprises a separate cooling compartment 310 attached to the end of the micro-cabinet 10, sharing a common wall 14b. As in previous embodiments, the micro-cabinet 10 includes an enclosure 12 comprising first and second side panels 13a and 13b, first and second end panels 14a and 14b, a bottom panel 15, and a top panel 16, which are preferably welded together or sealingly interconnected. The top panel 16 preferably includes an equipment access opening (not shown) through which equipment can be loaded into the cabinet 10 or accessed for repair and maintenance. The opening is closeable by a hatch door (not shown).

Figure 10:
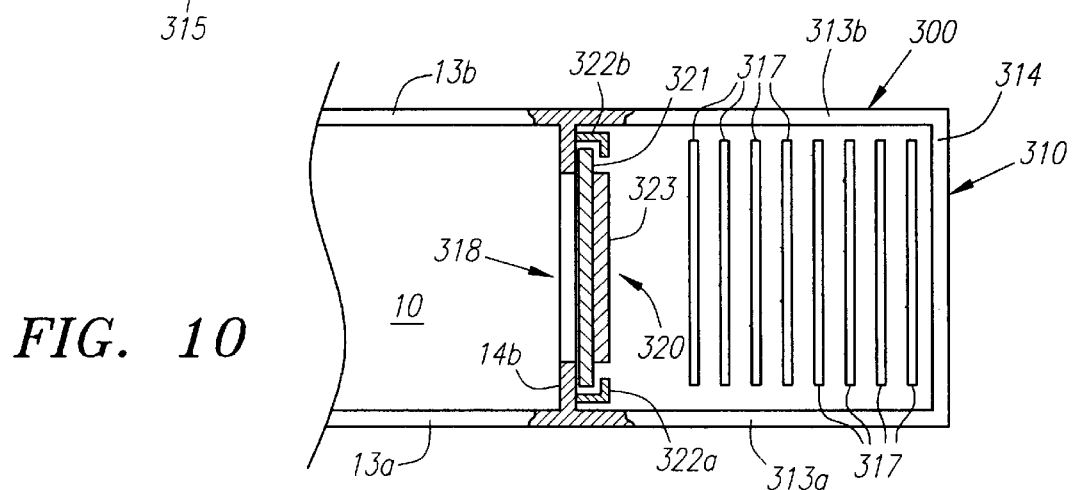
FIG. 10 is a top and partial sectional view of the micro-cabinet in FIG. 8a taken along line 10—10.
Figure 11:
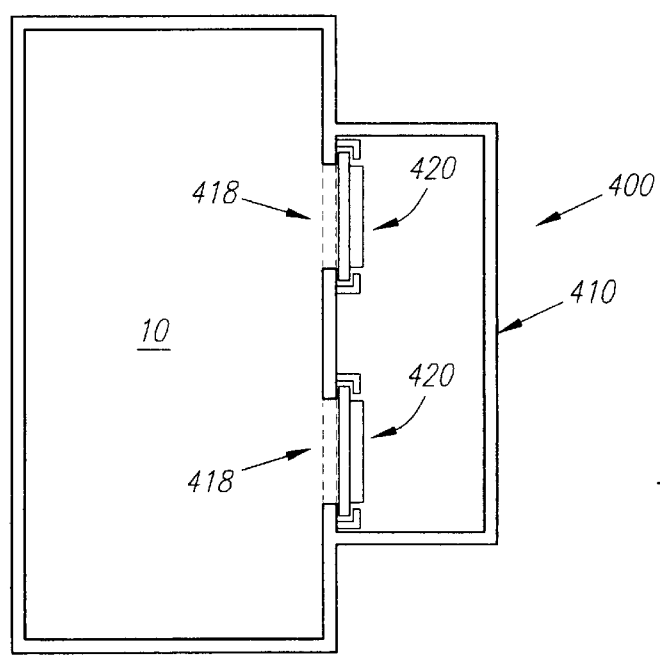
FIG. 11 is a top view of the micro-cabinet showing a cooling system alternative embodiment.

The cooling compartment 310 comprises a top panel 316, a bottom panel 315, an end panel 314, first and second side panels 313a and 313b, and the common wall 14b. An opening or cooling vent 318 is positioned toward the top of the common wall 14b to allow hot air and moisture to vent from the micro-cabinet 10 to the cooling compartment 310. The cooling compartment 310 has air vents 317 in the top panel 316, exposed to surface air. The air vents 317, which allow heat and moisture to escape from the vault 10, may comprise a series of holes or, as shown in FIG. 10, a series of slots 317. In either instance, the vents 317 are preferably louvered so that rain or water entering the cooling compartment 310 cannot fall through the opening 318 in the common wall 14b.

Figure 8A:
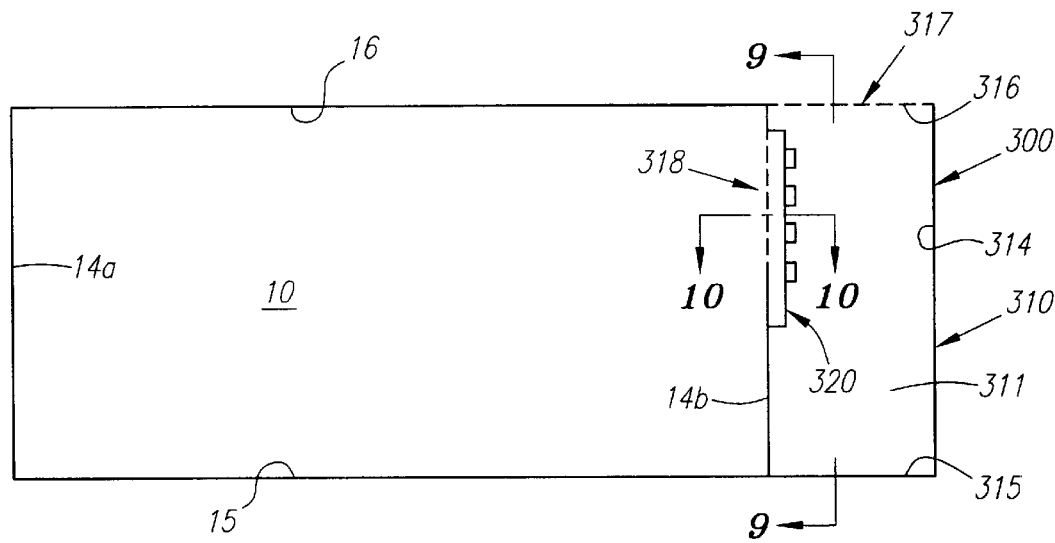
FIG. 8a and 8b are plan views of the micro-cabinet showing a cooling system alternative embodiment.
Figure 8B:
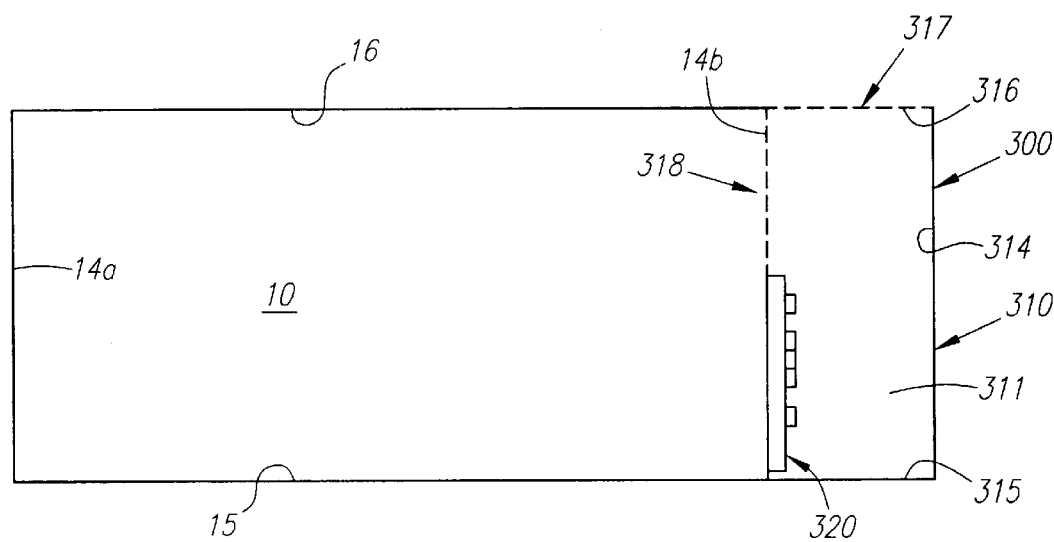
Figure 9:
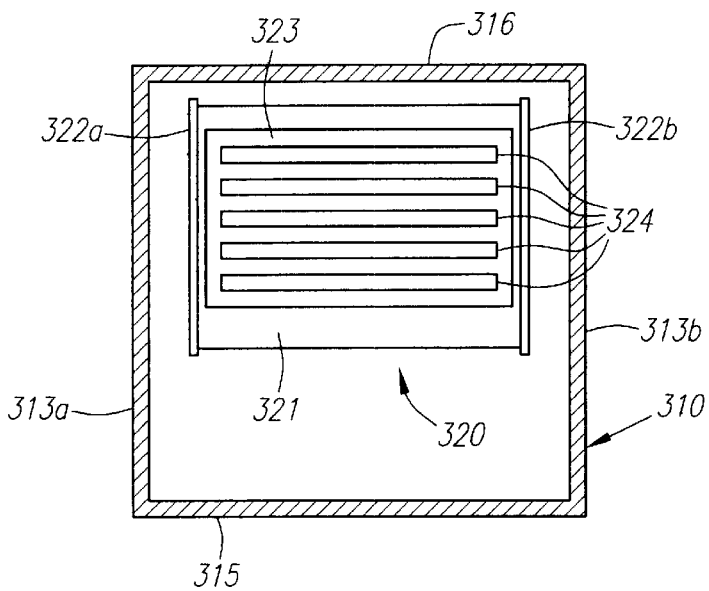
FIG. 9 Element number 313b on the left side of FIG. 9 has been changed to 313a. A marked version of FIG. 9 is attached with the amended portion appearing in red.

Should rain or other water enter the interior 311 of the cooling compartment 310 such that it rises to the level of the cooling vent 318, a closure system 320 is provided to seal the cooling vent 318. The closure system 320 preferably comprises a door 321 and a flotation device 322. The door 321 is mounted in moveable relation with the common wall 14b and is adapted to seal the cooling vent 318 in the common wall 14b. As shown in FIGS. 9 and 10, the door 321 is slidably mounted within a pair of opposing tracks 322a and 322b. The tracks 322a and 322b are mounted on the common wall 14b and run vertically adjacent to the sides of the cooling vent 318 in the common wall 14b. The tracks 322a and 322b preferably extend from the top of the cooling vent opening 318 toward the bottom panel 315 of the cooling compartment 310 beyond the bottom of the opening 318. As shown in FIGS. 8a and 8b, the door 321 slides or travels up from the bottom panel 315 of the cooling compartment 310 to completely seal the opening 318 in the common wall 14b.

The flotation device 323 comprises a floatable pad attached to the door 321 on the inside of the cooling compartment 310. Preferably, the pad 323 is formed from Styrofoam, but may be formed from other suitable material or may comprise an inflatable bladder. The pad 323 is substantially the same height and width as the door 321 and approximately one-inch thick, and preferably has a buoyancy value sufficient to raise the door 321 as water fill Is the compartment 310. To increase the surface area and, thus, the buoyancy of the pad 323, a series of channels or cutouts 323 are formed in the pad 323. If water floods the cooling compartment 310, the door 321 simultaneous rises as the water level rises in the interior 311 of the cooling compartment 310. With the aid of the water forcing the door 321 against the common wall 14b, the door 321 forms a water tight seal between the micro-cabinet 10 and the cooling compartment 310. However, in the absence of rain or flooding, the door 321 is open, allowing venting of heat and moisture from the micro-cabinet 10.

In an alternative embodiment, the closure mechanism 320 may include a float and pulley system (not shown) adapted to raise the door 321 as the water level in the cooling compartment 310 rises. Also, a gasket or the like may be positioned between the door 321 and the common wall 14b to further facilitate a water tight seal between the micro-cabinet 10 and the cooling compartment 310.

In yet a further alternative embodiment, the cooling system 400 of the present invention may comprise two or more closure mechanisms 420 mounted in the cooling compartment 410 and adapted to seal two or more cooling vents 418a and 418b formed in the common wall 14b between the micro-cabinet 10 and the cooling compartment 410. A multi-closure design tends to facilitate cooling without sacrificing effective sealing with larger sized micro-cabinets 10.

With this cooling system 300 or 400, weep holes (not shown) can be placed in the bottom of the vault or micro-cabinet 10 so that moisture or minute amounts or water may drain from the micro-cabinet 10. However, any moisture that is absorbed through the weep holes can evaporate through the cooling system 300 or 400. If excessive moisture is absorbed through the weep holes, a water pump, as discussed above, may be provided.

Unlike conventional designs, the vault or micro-cabinet 10 of the present invention can be placed in virtually any city, under any existing vertical structure, e.g., a light standard, which is mounted on or near a sidewalk, while being fully disguised, and tending to pose no hazards to pedestrians, who might otherwise trip on an exposed unit.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A cabinet for underground storage of wireless telecommunications equipment, comprising an enclosure adapted to house telecommunications equipment, and a cooling system adapted to exhaust heat and moisture from the enclosure, the cooling system including a cooling compartment attached to the enclosure, a first vent interconnecting the interiors of the cooling compartment and the enclosure, a second vent formed in the cooling compartment, and a closure mechanism moveable between first and second positions in relation to water entering the compartment, in the first position the closure mechanism fully obstructs the first vent and provides a water tight seal between the compartment and the enclosure.

2. The cabinet of claim 1 wherein the compartment and enclosure share a common wall.

3. The cabinet of claim 2 wherein the first vent is formed in the common wall toward the top of the common wall.

4. The cabinet of claim 3 wherein the closure mechanism includes a door mounted in sliding relation with the common wall and a flotation device coupled to the door.

5. The cabinet of claim 4 further comprising a pair of tracks mounted on the common wall adjacent opposing sides of the first vent, the door being slidably received within the pair of tracks.

6. The cabinet of claim 4 wherein the flotation device comprises an inflatable bladder.

7. The cabinet of claim 4 wherein the flotation device comprises a pad of floatable material mounted on the door inside of the compartment.

8. The cabinet of claim 7 wherein the pad includes a plurality of cutouts formed therein.

9. The cabinet of claim 7 wherein the pad is formed of Styrofoam.

10. The cabinet of claim 4 wherein the flotation device comprise a float coupled to the door through pulley system.

11. The cabinet of claim 2 further comprising a plurality of openings formed in the common wall and a plurality of closure mechanisms operably coupled to the openings.

12. The cabinet of claim 1 further comprising louvers mounted adjacent the second vent.

13. The cabinet of claim 1 further comprising a water evacuation system mounted within the enclosure, the evacuation system including a one-way pressure actuated exhaust valve.

14. The cabinet of claim 1 further comprising a weight assisted rack assembly for mounting electronic components within the enclosure.

15. The cabinet of claim 1 wherein the enclosure is submergeable under water without leakage of water into enclosure.

16. An antenna site for wireless telecommunications comprising a vertical structure, an antenna mounted atop of the vertical structure, a cabinet housing transceiver circuitry in electrical communication with the antenna, the cabinet being buried underground, and a cooling system including a cooling compartment attached to the cabinet and sharing a common wall with the cabinet, a first vent formed in the common wall, a second vent formed in a wall of the cooling compartment, and a door moveable between first and second positions in relation to water entering the compartment, in the first position the door fully obstructs the first vent and provides a water tight seal between the compartment and the cabinet.

17. The antenna site of claim 16 wherein the door is mounted in sliding relation with the common wall.

18. The antenna site of claim 17 further comprising a flotation device coupled to the door.

19. The cabinet of claim 17 further comprising a pair of tracks mounted on the common wall adjacent opposing sides of the first vent, the door being slidably received within the pair of tracks.

20. The cabinet of claim 17 wherein the flotation device comprises an inflatable bladder.

21. The cabinet of claim 17 wherein the flotation device comprises a pad of floatable material mounted on the door inside of the compartment.

22. The cabinet of claim 21 wherein the pad includes a plurality of cutouts formed therein.

23. The cabinet of claim 21 wherein the pad is formed of Styrofoam.

24. The cabinet of claim 16 further comprising a plurality of openings formed in the common wall and a plurality of doors operably coupled to the openings.

25. The cabinet of claim 16 further comprising louvers mounted adjacent the second vent.

26. The cabinet of claim 16 wherein the enclosure is submergeable under water without leakage of water into enclosure.

* * * * *